(12) United States Patent
Karna et al.

(10) Patent No.: US 9,806,273 B2
(45) Date of Patent: Oct. 31, 2017

(54) FIELD EFFECT TRANSISTOR ARRAY USING SINGLE WALL CARBON NANO-TUBES

(75) Inventors: Shashi P. Karna, Bel Air, MD (US); Govind Mallick, Bel Air, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 875 days.

(21) Appl. No.: 11/790,052

(22) Filed: Apr. 23, 2007

(65) Prior Publication Data
US 2008/0157061 A1    Jul. 3, 2008

Related U.S. Application Data

(60) Provisional application No. 60/878,064, filed on Jan. 3, 2007.

(51) Int. Cl.
H01L 29/12 (2006.01)
H01L 51/05 (2006.01)
B82Y 10/00 (2011.01)
H01L 51/00 (2006.01)

(52) U.S. Cl.
CPC .......... *H01L 51/0545* (2013.01); *B82Y 10/00* (2013.01); *H01L 51/0048* (2013.01)

(58) Field of Classification Search
CPC .. H01L 51/0545; H01L 51/0048; B82Y 10/00
USPC ......... 257/24, 40, E29.07, E21.051; 438/164
See application file for complete search history.

(56) References Cited

U.S. PATENT DOCUMENTS

| | | | |
|---|---|---|---|
| 6,423,583 B1* | 7/2002 | Avouris et al. | 438/132 |
| 6,515,339 B2* | 2/2003 | Shin et al. | 257/368 |
| 6,750,471 B2 | 6/2004 | Bethune et al. | |
| 6,798,000 B2 | 9/2004 | Luyken et al. | |
| 6,870,124 B2* | 3/2005 | Kumar et al. | 219/121.46 |
| 6,891,227 B2 | 5/2005 | Appenzeller et al. | |
| 6,900,479 B2 | 5/2005 | DeHon et al. | |
| 6,930,343 B2* | 8/2005 | Choi et al. | 257/296 |
| 6,972,467 B2* | 12/2005 | Zhang et al. | 257/401 |
| 7,014,743 B2* | 3/2006 | Zhou et al. | 204/547 |
| 7,015,500 B2 | 3/2006 | Choi et al. | |
| 7,030,408 B1 | 4/2006 | Kuekes et al. | |
| 7,115,901 B2 | 10/2006 | Bertin et al. | |
| 7,129,554 B2 | 10/2006 | Lieber et al. | |
| 7,135,728 B2 | 11/2006 | Duan et al. | |

(Continued)

OTHER PUBLICATIONS

El Khakani, M. A.; Yi, J. H. "The nanostructure and electrical properties of SWT bundle networks grown by an 'all-laser' growth process for annoelectronic device applications." Nanotechnology (2004), 15(10) S534-S539 Coden; NNOTER; ISSN: 0957-4484.*

(Continued)

*Primary Examiner* — Ori Nadav
(74) *Attorney, Agent, or Firm* — Christos S. Kyriakou; Eric B. Compton

(57) ABSTRACT

A field effect transistor array comprising a substrate and a plurality of single wall carbon nano-tubes disposed on a surface of the substrate. A plurality of electrodes are disposed over the nano-tubes such that the conductive strips are spaced-apart from each other. These electrodes form the contact point for the drain and source of the field effect transistor, while one or more of the nano-carbon tubes form the channel between the source and the drain.

18 Claims, 1 Drawing Sheet

(56) References Cited

U.S. PATENT DOCUMENTS

| | | | |
|---|---|---|---|
| 7,522,040 B2* | 4/2009 | Passmore et al. | 340/540 |
| 7,687,841 B2* | 3/2010 | Sandhu | 257/296 |
| 7,956,525 B2* | 6/2011 | Armitage et al. | 313/309 |
| 2002/0130353 A1* | 9/2002 | Lieber et al. | 257/315 |
| 2003/0068432 A1* | 4/2003 | Dai et al. | 427/58 |
| 2003/0227015 A1 | 12/2003 | Choi et al. | |
| 2003/0228467 A1* | 12/2003 | Liebau et al. | 428/408 |
| 2004/0201064 A1 | 10/2004 | Hirai et al. | |
| 2005/0129573 A1* | 6/2005 | Gabriel et al. | 422/58 |
| 2005/0157445 A1* | 7/2005 | Bradley et al. | 361/226 |
| 2005/0167655 A1* | 8/2005 | Furukawa et al. | 257/20 |
| 2005/0242344 A1* | 11/2005 | Lee et al. | 257/40 |
| 2005/0244326 A1* | 11/2005 | Colbert et al. | 423/447.1 |
| 2005/0279988 A1 | 12/2005 | Bertin | |
| 2006/0169585 A1 | 8/2006 | Nagahara et al. | |
| 2006/0175601 A1 | 8/2006 | Lieber et al. | |
| 2006/0237708 A1 | 10/2006 | Choi et al. | |
| 2007/0110741 A1* | 5/2007 | Geckeler et al. | 424/125 |
| 2007/0132043 A1* | 6/2007 | Bradley et al. | 257/414 |
| 2008/0149970 A1* | 6/2008 | Thomas et al. | 257/288 |
| 2009/0232724 A1* | 9/2009 | Afzali-Ardakani et al. | 423/447.2 |

OTHER PUBLICATIONS

Lastella et al. Parallel arrays of individually addressable single-walled carbon nanotube field-effect transistors. Journal of Applied Physics 99, 024302 (2006).
Iijima. Helical microtubules of graphitic carbon. Nature 354, 56-58 (Nov. 7, 1991).
Mintmire et al. Are Fullerene Tubules Metallic? Physical Review Letters 68(5), 631-634 (Feb. 3, 1992).
Hamada et al. New One-Dimensional Conductors: Graphitic Microtubules. Physical Review Letters 68(10), 1579-1581 (Mar. 9, 1992).
Saito et al. Electronic structure of chiral graphene tubules. Applied Physics Letters 60(18), 2204-2206 (May 4, 1992).
Ebbesen et al. Electrical conductivity of individual carbon nanotubes. Nature 382, 54-56 (Jul. 4, 1996).
Wildoer et al. Electronic structure of atomically resolved carbon nanotubes. Nature 391, 59-62 (Jan. 1, 1998).
Odom et al. Atomic structure and electronic properties of single-walled carbon nanotubes. Nature 391, 62-64 (Jan. 1, 1998).
Qi et al. Miniature Organic Transistors with Carbon Nanotubes as Quasi-One-Dimensional Electrodes. J. Am. Chem. Soc. 126, 11774-11775 (2004).
Fuhrer et al. Crossed Nanotube Junctions. Science 288, 494-497 (Apr. 21, 2000).
Papadopoulos et al. Electronic Transport in Y-Junction Carbon Nanotubes. Physical Review Letters 85(16), 3476-3479 (Oct. 16, 2000).
Satishkumar et al. Y-junction carbon nanotubes. Applied Physics Letters 77(16), 2530-2532 (Oct. 16, 2000).
Tans et al. Room-temperature transistor based on a single carbon nanotube. Nature 393, 49-52 (May 7, 1998).
Martel et al. Single- and multi-wall carbon nanotube field-effect transistors. Applied Physics Letters 73(17), 2447-2449 (Oct. 26, 1998).
Bachtold et al. Logic Circuits with Carbon Nanotube Transistors. Science 294, 1317-1320 (Nov. 9, 2001).

Wind et al. Vertical scaling of carbon nanotube field-effect transistors using top gate electronics. Applied Physics Letters 80(20), 3817-3819 (May 20, 2002).
Slides which were contemporaneously displayed during the presentation titled "Simple, High Yield Nano-device Fabrication via SWNT Controlled Growth from a Catalytic Block Copolymer," at the 2005 American Physical Society (APS) March Meeting held Mar. 21-25, 2005 in Los Angeles, CA. This presentation was given at the A14 focus session on Mar. 21, 2005 from 9:24AM-9:36AM.
Abstract titled "Simple, High Yield Nano-device Fabrication via SWNT Controlled Growth from a Catalytic Block Copolymer" corresponding to presentation of the same title given at the 2005 American Physical Society (APS) March Meeting held Mar. 21-25, 2005 in Los Angeles, CA. This abstract was distributed to meeting attendees prior to the meeting (as part of the meeting agenda).
Sarah Lastella, et al., "Chemical Vapor Deposition Grown Single-Walled Carbon Nanotube Junctions for Nano-Electronics and Sensors," presented at the Army Science Conference (24th) held on Nov. 29-Dec. 2, 2005 in Orlando, Florida.
Lastella, Parallel arrays of inidividually adressable singl-walled carbon nanotube filed-effec transistors, J. of Appl. Phys., 99, 0234302-1-4 (2006).
Collins, Engineering Carbon Nanotubes and Nanotube Circuits Using Electrical Breakdown, Science 292, 706 (2001).
Seidel, Bias dependence and electrical breakdown of small diameter single-walled carbon nanotubes, J. Appl. Phys. 96, 6694 (2004).
Balasubramanian, A Selective Electrochemical Approach to Carbon Nanotube Field-Effect TransistorsNano Lett. 4, 827 (2004).
An, A Simple Chemical Route to Selectively Eliminate Metallic Carbon Nanotubes in Nanotube Network Devices, J. Am. Chem. Soc. 126, 10520 (2004).
Someya, Alcohol Vapor Sensors Based on Single-Walled Carbon Nanotube Field Effect Transistors, Nano Lett. 3, 877 (2003).
Kong, Synthesis of individual singlewalled carbon nanotubes on patterned siliconwafers, Nature London 395, 878 (1998).
Franklin, Integration of suspended carbon nanotube arrays into electronic devices and electromechanical systems, Appl. Phys. Lett. 81, 913 (2002).
Tseng, Monolithic Integration of Carbon Nanotube Devices with Silicon MOS Technology, Nano Lett. 4, 123 (2004).
Javey, Electrical properties and devices of large-diameter single-walled carbon nanotubes, Appl. Phys. Lett. 80, 1064 (2002).
Snow, High-mobility carbon-nanotube thin-film transistors on a polymeric substrate, Appl. Phys. Lett. 86, 33105 (2005).
Li, Carbon Nanotube Sensors for Gas and Organic Vapor Detection, Nano Lett. 3, 929 (2003).
Lastella, Density control of single-walled carbon nanotubes using patterned iron nanoparticle catalysts derived from phaseseparated thin films, J. Mater. Chem. 14, 1791 (2004).
Seidel, High-Current Nanotube Transistors, Nano Lett. 4, 831 (2004).
Zhou, Electrical measurements of individual semiconducting single-walled carbon nanotubes of various diameters, Appl. Phys. Lett. 76, 1597 2000.
Krupke, Separation of Metallic from Semiconducting Single-Walled Carbon Nanotubes, Science 301, 344 (2003).
Qi, Toward Large Arrays of Multiplex Functionalized Carbon Nanotube Sensors for Highly Sensitive and Selective Molecular Detection, Nano Lett. 3, 347 (2003).

* cited by examiner

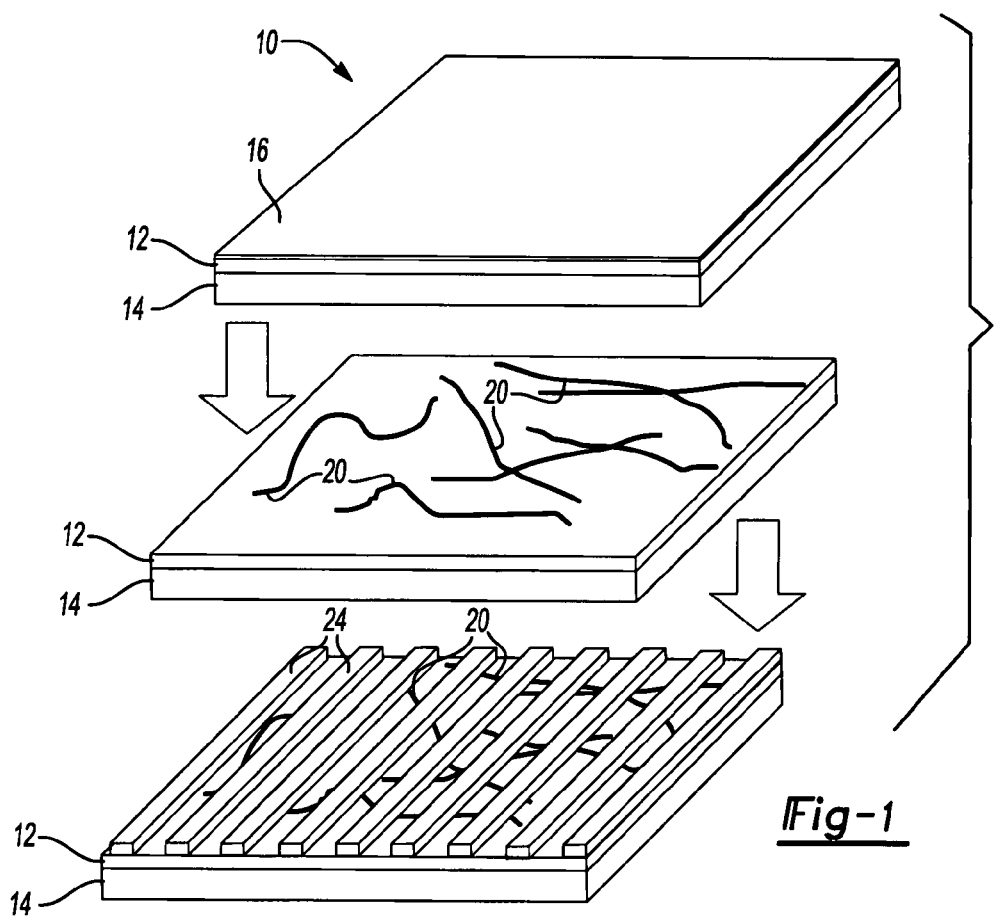
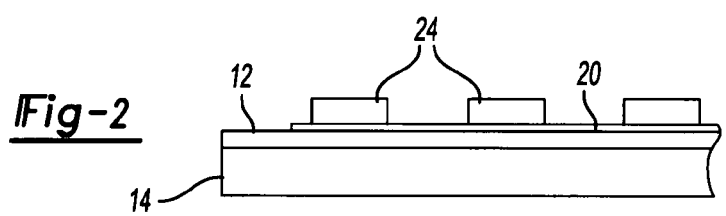
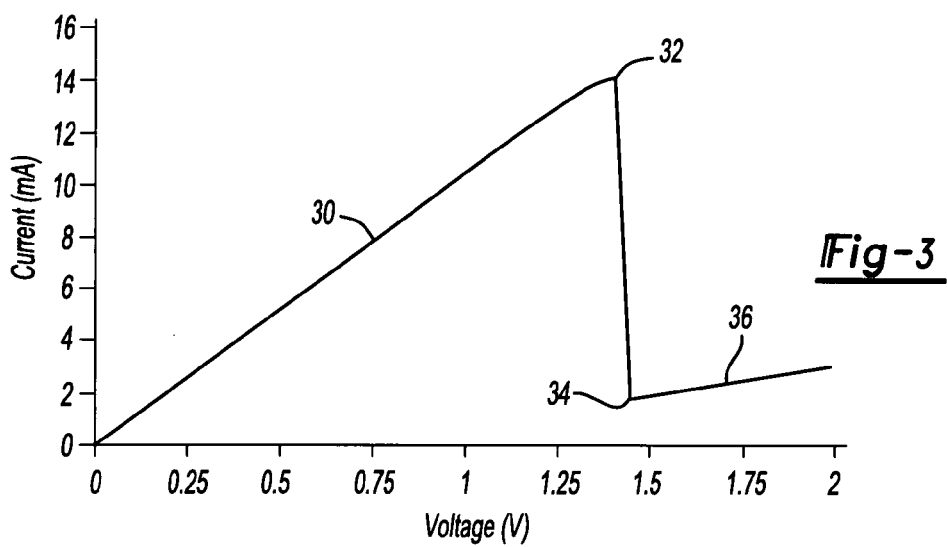

FIELD EFFECT TRANSISTOR ARRAY USING SINGLE WALL CARBON NANO-TUBES

CROSS-REFERENCE TO RELATED APPLICATIONS

This patent application claims the benefit of U.S. Provisional Patent Application Ser. No. 60/878,064, filed 3 Jan. 2007, the contents of which are incorporated herein by reference.

GOVERNMENT INTEREST

The invention described herein may be manufactured, used, and licensed by or for the United States Government.

BACKGROUND OF THE INVENTION

1. Field of the Invention

The present invention relates generally to field effect transistors and, more particularly, to a field effect transistor array which utilizes single wall carbon nano-tubes as the channel for the field effect transistors.

2. Description of the Related Art

Carbon nano-tubes are perhaps the best available material for realizing nano and molecular scale electronics and sensor devices. Indeed, experiments demonstrating the use of single wall nano-tubes as the active channel in a MOS field effect transistor (FET) have opened the possibility for a wide range of integrated carbon nano-tube nano electronics.

The assembly and fabrication of carbon nano-tube electronic devices, however, disadvantageously requires several tedious steps to realize a single or a few functional devices. Furthermore, these previously known assembly and fabrication methods do not lend themselves to high-yield microcircuit production.

SUMMARY OF THE INVENTION

The present invention provides a field effect transistor (FET) array utilizing single wall carbon nano-tubes as the channel for the transistor, as well as a method for fabricating the FET which overcomes all the above-mentioned disadvantages of the previously known devices and methods.

In brief, in the present invention, a metal oxide layer is formed on a highly N-doped silicon substrate using conventional semiconductor fabrication techniques. Thereafter, an iron-containing catalyst precursor polymer film is spinned on the substrate, thus forming a thin layer of the iron-containing polymer on the substrate.

Thereafter, single wall carbon nano-tubes are grown in the polymer film by chemical vapor deposition such that, following the chemical vapor deposition, relatively long strands of single wall carbon nano-tubes are formed on the metal oxide layer on the substrate. The single wall nano-tubes may be either single tubes or thin, uniform bundles of tubes.

After formation of the carbon nano-tubes on the oxide layer of the metal substrate, a plurality of electrodes are deposited over the nano-tubes so that the electrodes are spaced apart and parallel to each other. Preferably, the electrodes comprise a titanium and gold alloy. The titanium layer improves the adhesion of the gold electrodes to the substrate.

The carbon nano-tubes formed on the substrate include both metallic carbon nano-tubes, as well as semiconductor carbon nano-tubes. The metallic carbon nano-tubes, which do not exhibit the semiconductor characteristics desired for a field effect transistor, are then destroyed by applying a relatively high voltage, e.g. 1-2 volts, between each successive pair of electrodes, thus leaving only the desired semiconductor carbon nano-tubes between adjacent electrodes.

Following destruction of the metallic carbon nano-tubes, a plurality of individually addressable field effect transistors remain with adjacent electrodes forming the source and drain for each field effect transistor.

BRIEF DESCRIPTION OF THE DRAWINGS

A better understanding of the present can be had upon reference to the following detailed description when read in conjunction with the accompanying drawing, wherein like reference characters refer to like parts throughout the several views, and in which:

FIG. 1 is a diagrammatic view illustrating a preferred embodiment of the present invention;

FIG. 2 is a fragmentary sectional view of the preferred embodiment of the invention; and FIG. 3 is a graph illustrating the destruction of metal carbon nano-tubes.

DETAILED DESCRIPTION OF THE PREFERRED EMBODIMENT OF THE PRESENT INVENTION

With reference first to FIGS. 1 and 2, a process for forming a field effect transistor array 10 utilizing single wall carbon nano-tubes as a channel is illustrated. As shown at 10 in FIG. 1, a thermal oxide layer 12 is formed on a semiconductor substrate 14. The semiconductor substrate 14 is preferably silicon and is heavily N-doped. Furthermore, conventional semiconductor processing methods are utilized to form the thermal oxide layer 12 on the substrate 14 so that the thermal oxide layer 12 is approximately 1,000 angstroms in thickness, although the thickness of the oxide layer 12 may vary without deviation from the spirit or scope of the invention.

Following the formation of the thermal oxide layer 12 on the substrate 14, an iron-containing catalytic polymer 16 (FIG. 1) is spun on top of the oxide layer 12 such that the thickness of the polymer coating 16 is relatively thin, for example, in the range of about 10 microns in thickness.

A plurality of nano-tubes 20 are then grown or formed on the polymer containing substrate by subjecting it to chemical vapor deposition. For example, with the substrate 14 heated to approximately 400° C., a reactive gas, such as carbon dioxide, is blown over the wafer for 20-30 minutes. At this temperature the polymer film breaks into hydrocarbon gases leaving behind iron atoms Fe which form nano-size particles that serve as catalysts for the growth of the nano-tubes. The carbon atoms in the gas start forming cage-type structures or tubules on nano-size Fe particles and grow from there into single wall carbon nano-tubes. During the carbon nano-tube formation, the carbon nano-tubes 20 grow in random directions on the wafer/substrate 14.

A plurality of electrodes 24 are then deposited on top of the nano-tubes 20 of the substrate 14 such that the electrodes 24 are elongated and spaced-apart and parallel to each other. For example, the electrodes 24 may be approximately 100 micrometers in width and spaced-apart from each other by about 7.5 microns.

Lithographic metal electrode deposition techniques are used to form the electrodes 24. For example, electrodes 24 are preferably formed of a titanium and gold alloy in which the titanium increases the adhesion of the electrodes 24 to the upper surface of the wafer while the gold exhibits maximum conductivity.

The entire structure is then preferably annealed at about 200° C. for about 30 minutes in a nitrogen atmosphere to improve the electrodes and nano-tube interface.

After the electrodes 24 have been deposited on the wafer, adjacent electrical electrodes form the source and drain of a field effect transistor with the substrate 14 forming the gate. One or more nano-tubes extending between adjacent pairs of electrodes 24 form the channel for the field effect transistor.

The single wall carbon nano-tubes 20 formed on the wafer surface typically contain both metallic carbon nano-tubes, and semiconductor nano-tubes. The metallic carbon nano-tubes, furthermore, do not exhibit the desired semiconductor properties for the field effect transistor.

Consequently, in order to destroy the metallic single wall carbon nano-tubes, a relatively high voltage, e.g. 1-2 volts, is applied between each successive pair of electrodes 24, while maintaining the gate in a state of saturation. As shown in FIG. 3, the current increases steadily, and generally linearly, as shown at 30, as the volts between the source and drain increases until approximately 1.4 volts. At this point 32, the metal tubes are destroyed by the high voltage without damaging the semiconductor carbon nano-tubes. This, in turn, results in a dramatic decrease of the current, as shown at point 34. Thereafter, the semiconductor carbon nano-tubes form the channel and exhibit semiconductor properties, as shown at 36.

Following the destruction of the metallic carbon nano-tubes, a field effect transistor array results in which each pair of electrodes 24 form an individually addressable field effect transistor assuming, of course, that a sufficient number of semiconductor carbon nano-tubes extend between and connect two adjacent electrodes. Individual testing and mapping of each of the field effect transistors on the array may then be performed to determine which field effect transistors exhibit satisfactory performance and which do not.

From the foregoing, it can be seen that the present invention provides a field effect array utilizing single wall carbon nano-tubes as the channel which enjoys a simple way for processing. Having described our invention, however, many modifications thereto will become apparent to those of skill in the art to which pertains without deviation from the spirit of the invention as defined by the scope of the appended claims.

We claim:

1. A field effect transistor comprising
a substrate,
a semiconducting channel for transistor action comprising substantially only a plurality of semiconducting carbon nano-tubes disposed on a surface of said substrate wherein said plurality of carbon nano-tubes are disposed in random directions parallel to said surface of said substrate, and
a plurality of electrodes disposed over said plurality of semiconducting carbon nano-tubes such that said electrodes are spaced apart from each other,
wherein said electrodes are linear, elongated and parallel to each other so that at least one of said nano-tube extends below and connects at least two of the plurality of electrodes.

2. The transistor as defined in claim 1 wherein said substrate comprises a doped silicon layer covered at least in part by an electrical insulating layer.

3. The transistor as defined in claim 2 wherein said insulating layer comprises an oxide layer.

4. The transistor as defined in claim 1 wherein each said electrode comprises gold.

5. The transistor as defined in claim 1 wherein the electrodes comprise a titanium and gold alloy.

6. The transistor as defined in claim 1 wherein the carbon nano-tubes comprise single wall carbon nano-tubes.

7. The transistor as defined in claim 6 wherein the single wall carbon nano-tubes are randomly disposed on the surface of said substrate in bundles that comprise single wall carbon nano-tubes wherein the bundles are disposed on the surface of said substrate at a density of from 3 to 6 bundles per 100 $\mu m^2$.

8. The transistor as defined in claim 1 wherein the carbon nano-tubes are randomly disposed on the surface of said substrate in bundles and further wherein between 375 and 500 bundles extend below and connect one of said plurality of electrodes to an adjacent electrode.

9. A metal-oxide semiconductor field effect transistor comprising:
a substrate,
an electrical insulating layer disposed on said substrate,
a semiconducting channel for transistor action comprising substantially only a plurality of semiconducting single wall carbon nano-tubes disposed in random horizontal directions on a said electrical insulating layer,
a plurality of electrodes disposed over said plurality of semiconducting single wall carbon nano-tubes such that said electrodes are spaced apart from each other,
wherein said plurality of single wall carbon nano-tubes randomly disposed on the surface of said substrate contain a density of from 3 to 6 bundles of disentangled, nearly-defect-free single-walled carbon nano-tubes per 100 $\mu m^2$.

10. A method of fabricating a field effect transistor having a semiconducting channel for transistor action, the method comprising the steps of:
forming an electrical insulating layer on a doped silicon substrate,
growing carbon nano-tubes on said insulating layer in random directions that are parallel to a surface of said insulating layer,
removing metallic nano-tubes while leaving substantially only semiconducting nano-tubes which had been grown on said insulating layer to form the semiconducting channel, and
depositing a plurality of spaced apart electrodes on said semiconducting carbon nano-tubes and said insulating layer,
wherein said electrodes are linear, elongated and parallel to each other so that at least one of said semiconducting carbon nano-tube extends below and connects at least two of the plurality of electrodes.

11. The method as defined in claim 10 wherein said growing step further comprises the step of applying a layer of iron containing polymer on said substrate and thereafter subjecting said polymer layer to a reactive gas.

12. The method as defined in claim 10 and further comprising the step of applying a voltage across said nano-tubes in a magnitude sufficient to destroy metallic nano-tubes but insufficient to harm semiconductor nano-tubes.

13. The method as defined in claim 10 wherein said electrodes comprise a gold and titanium alloy.

14. The method as defined in claim 10 wherein said forming step further comprises the step of forming an oxide layer on said doped silicon substrate.

15. The method as defined in claim 10 wherein said growing step further comprises the steps of applying an iron containing polymer layer to said insulating layer and thereafter subjecting said polymer layer to a reactive gas.

16. The method as defined in claim 10 wherein the carbon nano-tubes comprise single wall carbon nano-tubes.

17. The method as defined in claim 16 wherein the single wall carbon nano-tubes are randomly grown on the surface of said substrate in bundles that comprise single wall carbon nano-tubes and at a density of from 3 to 6 bundles per 100 $\mu m^2$.

18. A method of fabricating a metal-oxide semiconductor field effect transistor having a semiconducting channel for transistor action, the method comprising the steps of:
   forming an electrical insulating layer on a heavily doped conducting silicon substrate,
   depositing a catalyst precursor polymer over the electrical insulating layer,
   growing a plurality of single-walled carbon nano-tubes on said insulating layer in random directions that are parallel to said insulating layer,
   removing metallic nano-tubes while leaving substantially only semiconducting single-walled carbon nano-tubes which had been grown on said insulating layer to form the semiconducting channel for transistor action,
   depositing a plurality of spaced apart metal electrodes on said semiconducting carbon nano-tubes and said insulating layer, said metal electrodes forming contacts for a drain and a source of said transistor,
   wherein said plurality of single wall carbon nano-tubes are randomly grown on the surface of said substrate containing a density of from 3 to 6 bundles of disentangled, nearly-defect-free single-walled carbon nano-tubes per 100 $\mu m^2$.

* * * * *